(12) United States Patent
Hsu

(10) Patent No.: US 6,518,740 B1
(45) Date of Patent: Feb. 11, 2003

(54) ALTERNATING CURRENT METER WITH PHOTOELECTRIC DIGITAL COUNTER STRUCTURE

(76) Inventor: Chao Fou Hsu, No. 20, Yonguang Rd., Kaohsiung (TW)

(*) Notice: Subject to any disclaimer, the term of this patent is extended or adjusted under 35 U.S.C. 154(b) by 0 days.

(21) Appl. No.: 09/575,227

(22) Filed: May 22, 2000

(30) Foreign Application Priority Data

Dec. 3, 1999 (TW) .................................. 088220729

(51) Int. Cl.⁷ .............................................. G01R 21/00
(52) U.S. Cl. ...................................................... 324/74
(58) Field of Search ........................ 324/74, 72.5, 150, 324/556, 156, 96, 142; 250/231.13, 231.14, 231.16, 231.17; 340/870.02; 379/106.3

(56) References Cited

U.S. PATENT DOCUMENTS

| | | | |
|---|---|---|---|
| 4,304,994 A | * 12/1981 | Yamazaki et al. | 250/304 |
| 4,428,088 A | * 1/1984 | Getz et al. | 68/12.19 |
| 4,489,384 A | * 12/1984 | Hurley et al. | 702/61 |
| 4,774,922 A | * 10/1988 | Morita | 123/425 |
| 4,835,753 A | * 5/1989 | Yasuda | 369/32 |
| 5,530,331 A | * 6/1996 | Hanei | 318/592 |
| 5,563,515 A | * 10/1996 | Kako | 324/391 |

* cited by examiner

*Primary Examiner*—N. Le
*Assistant Examiner*—Vincent Q. Nguyen
(74) *Attorney, Agent, or Firm*—Raymond Y. Chan; David & Raymond Patent Group

(57) ABSTRACT

An alternating current meter with photoelectric digital counter structure having a metal rotary disk, a light-emitting element, a photosensing element, and a signal line. The metal rotary disk is provided in a face plate thereof with a vertical through hole. The light-emitting element and the photosensing element are located at the positions corresponding to two opposite ends of the through hole of the metal rotary disk. As the metal rotary disk completes one revolution, one light signal emitted by the light-emitting element is received by the photosensing element. The light signal is then converted into a digital signal, which is transmitted to an electronic counter or a remote terminal via the signal line.

2 Claims, 2 Drawing Sheets

ALTERNATING CURRENT METER WITH PHOTOELECTRIC DIGITAL COUNTER STRUCTURE

FIELD OF THE PRESENT INVENTION

The present invention relates generally to an electricity consumption counter of the alternating current electric meter, and more particularly to an electronic digital counter of the alternating current meter. The electronic digital counter is capable of converting the data of the electricity consumption into digital signals, which are then transmitted by the electronic digital counter.

BACKGROUND OF THE PRESENT INVENTION

The consumptions of the alternating current and the three-phase current by the industry and the private home are measured by the induction-type electric meter, which comprises an electric current magnet 10, a voltage magnet 20, an arresting magnet 30, and a mechanical counter 40, as shown in FIG. 1. The mechanical counter 40 is formed of a metal rotary disk 41 and a gear train counter 42. The metal rotary disk 41 is provided at the center thereof with a center shaft 43 which is pivotally fastened at the bottom thereof with the housing of the alternating current meter. As soon as the power consumption begins, the current flows into the alternation current meter such that the voltage magnet 20 effects a movable magnetic field. The metal rotary disk 41 is induced by the magnetic field of the voltage magnet 20 to turn such that a worm 44 is actuated to turn on the center shaft 43. In view of the worm 44 being engaged with a worm gear 45 of the gear train counter 42, the rotational speed of the metal rotary disk 41 is transmitted to the counter 42. As a result, the numerical data of the revolutions of the metal rotary disk 41 are exhibited by the counter 42. The numerical data represent the power consumption by a client of the power company. It is therefore necessary for the power company to hire a number of persons to record the numerical data described above. Such a practice of the manual recording of the numerical data of power consumption is not cost-effective. In addition, the counter 42 is in fact not reliable in view of the mechanical deficiencies of the electric meter. The function of the counter 42 is carried out by a plurality of gear train sets which are used in the cumulative counting and the number switching. In the transmission process from the metal rotary disk 41 to the counter 42, the mechanical error of the engagement of the gears can take place at any time. The problem is further compounded by the inherent error of the counter 42. The accumulative error can result in a substantial financial loss to either the power user or the power company.

SUMMARY OF THE PRESENT INVENTION

It is the main objective of the present invention to provide an alternating current electric meter with a photoelectric digital counter in place of the conventional mechanical counter which is susceptible to mechanical error.

It is another objective of the present invention to provide an alternating current electric meter which is simple in construction and is free from the error caused by the mechanical transmission.

It is still another objective of the present invention to provide an alternating current electric meter which is small in size, light in weight, and cost-effective.

It is still another objective of the present invention to provide an alternating current capable of transmitting an electronic digital signal to a remote terminal, thereby eliminating the costly man power for the on-site recording of the power consumption by a client of the power company.

DETAILED DESCRIPTION OF THE PREFERRED EMBODIMENT

Figure 1:
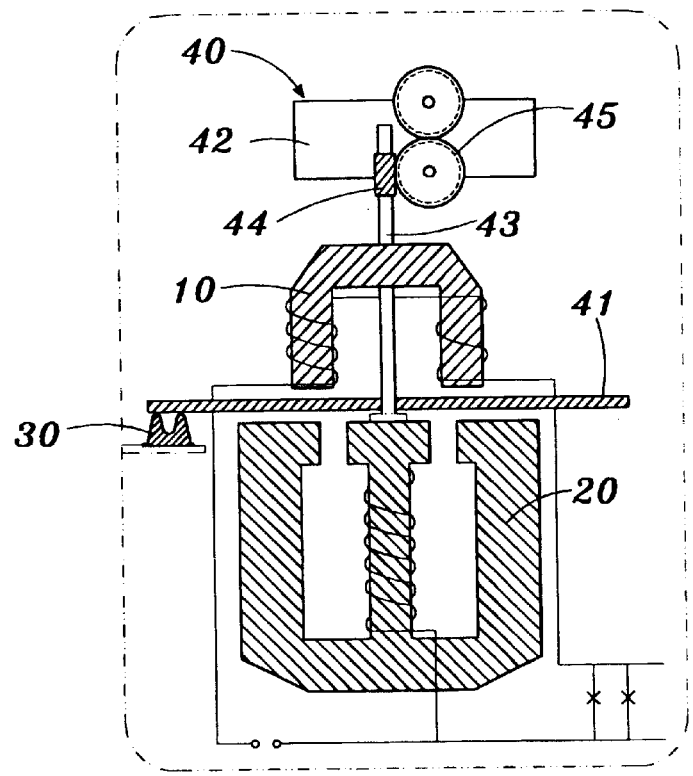
FIG. 1 is a schematic view of an induction-type electric meter of the prior art.
Figure 2:
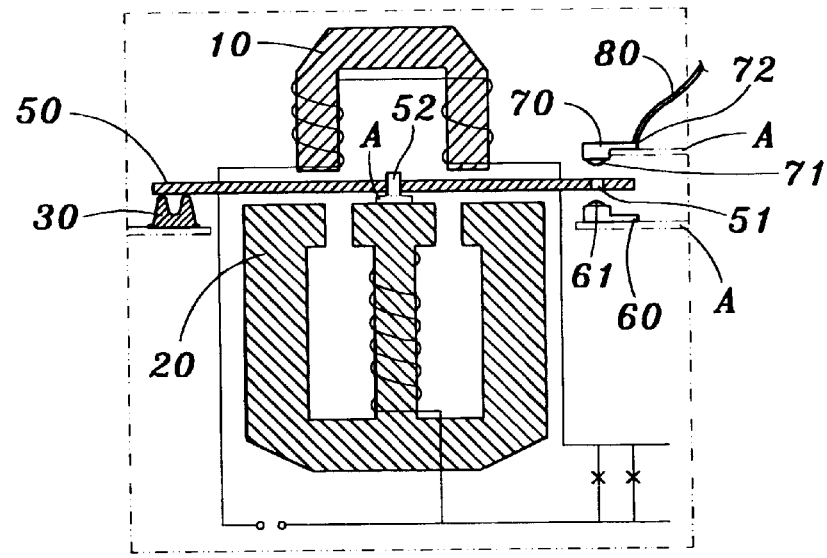
FIG. 2 is a schematic view of alternating current meter with photoelectric digital counter structure according to a first preferred embodiment of the present invention.

Referring to FIG. 2, an alternating current meter with photoelectric digital counter structure according to a first preferred embodiment of the present invention, which comprises a metal rotary disk 50, a light-emitting element 60, a photosensing element 70, and a signal line 80.

The metal rotary disk 50 has a face plate which is provided with a vertical through hole 51 and is further provided in the center thereof with a center shaft 52 which is pivotally fastened at the bottom end thereof with a housing "A" of the alternating current electric meter, as shown by the imaginary lines in FIG. 2. The metal rotary disk 50 is induced by the magnetic field to turn such that the center shaft 52 turns simultaneously. The light-emitting element 60 and the photosensing element 70 are fastened with the housing "A" such that the light-emitting element 60 is corresponding in location to one of the face plates of the metal rotary disk 50, and that the light-emitting element 60 is separated from the metal rotary disk 50 by an appropriate distance. The light-emitting element 60 has a light-emitting end 61 capable of emitting light which is projected on the moving path of the vertical through hole 51. The photosensing element 70 is located on other face plate of the metal rotary disk 50 such that the photosensing element 70 is separated from the metal rotary disk 50 by an appropriate distance, and that a light receiving end 71 of the photosensing element 70 is corresponding in location to the light-emitting end 61 of the light-emitting element 60. The photosensing element 70 has a signal output end 72, which is connected with the signal line 80.

As soon as the power consumption begins, the metal rotary disk 50 is driven to turn by the magnetic field of the voltage magnet 20. In the meantime, the light emitted by the light emitting end 61 of the light-emitting element 60 is projected continuously on the face plate of the metal rotary disk 50. When the through hole 51 of the metal rotary disk 50 in motion arrives at the position where the light-emitting element 60 is located, the light signal emitted by the light-emitting end 61 is received by the light-receiving end 71 of the photosensing element 70 via the through hole 51 of the metal rotary disk 50. In other word, when the metal rotary disk 50 in motion completes one revolution, the light signal is received once by the photosensing element 70. As long as the metal rotary disk 50 turns, the photosensing element 70 receives the light signal intermittently. The light signal is then converted into a digital signal which is transmitted via the signal line 80 to an electronic counter or a remote terminal. The transmission of the digital signal of the present invention is attained without the use of the mechanical transmission.

Figure 3:
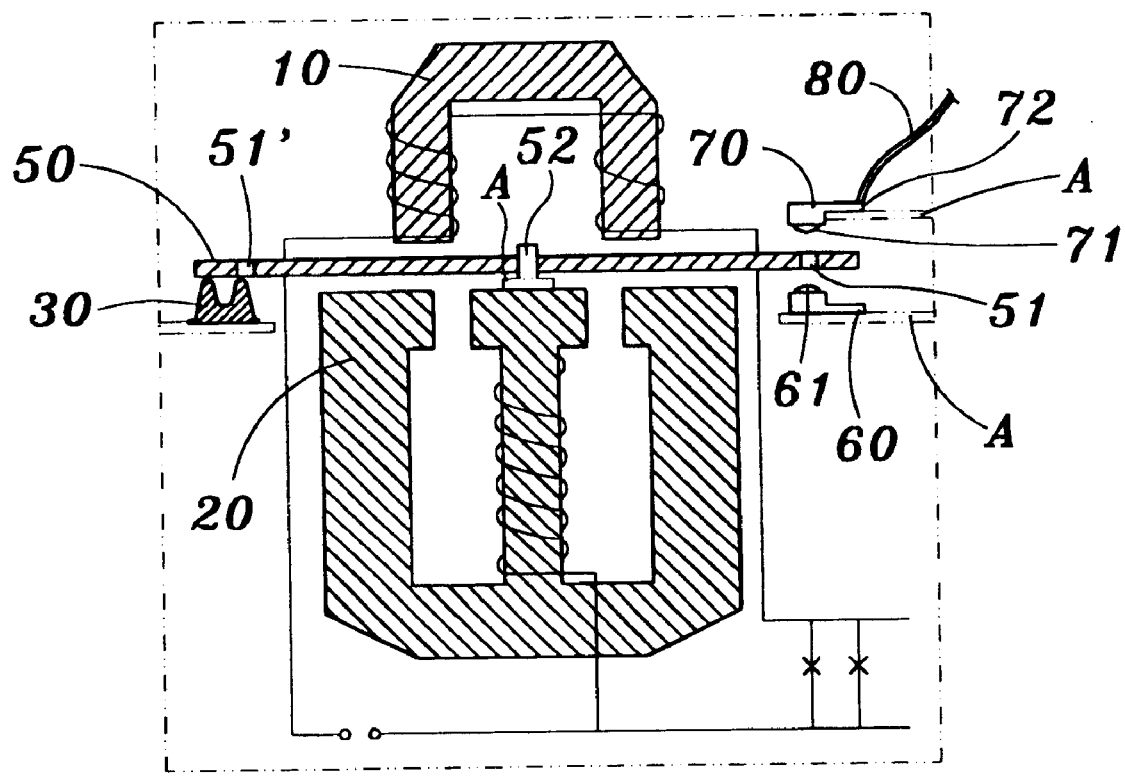
FIG. 3 is a schematic view of alternating current meter with photoelectric digital counter structure according to a second preferred embodiment of the present invention.

As shown in FIG. 3, the metal rotary disk 50 is provided additionally with at least one vertical through hole 51' in addition to the first vertical through hole 51. As a result, two light signals are received by the photosensing element 70 via the two through holes 51 and 51' when the rotating disk 50 completes one revolution. The addition of the through hole of the metal rotary disk 50 results in a more precise reading of the power consumption.

It is therefore readily apparent that the electric meter of the present invention has advantages over the conventional electric meter. In the first place, the present invention is free from the error caused by the mechanical transmission of the conventional electric meter. In addition, the present invention is free from the gear train counter and the worm gear and is therefore small in size, light in weight, and cost-effective. Moreover, the present invention eliminates the costly man power for the on-site recording of the power consumption.

What is claimed is:

1. An induction-type alternating current meter, comprising:

a housing, an electric current magnet disposed in said housing;

a voltage magnet disposed in said housing and positioned opposing said electric current magnet to induce a magnetic field therebetween;

an arresting magnet supported in a middle portion of said housing; and a photoelectric digital counter which comprises:
      a signal line;
      a metal rotary disk, which has two opposing side face and a through hole provided at a periphery edge thereof, comprising a center shaft pivotally mounted at a center of said metal rotary disk, wherein said metal rotary disk is coaxially and rotatably supported between said electric current magnet and said voltage magnet while said periphery edge of said metal rotary disk is arranged to be capable of rotating right above said arresting magnet, wherein said metal rotary disk is induced by said magnetic field to rotate with said center shaft simultaneously about an axis of said center shaft and a circular moving path of said through hole is defined when said through hole rotates with said metal rotary disk;
      a light-emitting element, which is fastened to face one of said side face of said metal rotary disk inside said housing, having a light emitting end extended to position adjacent to said periphery edge of said metal rotary disk and define a distance between said light emitting end and said periphery edge of said metal rotary disk, wherein a light signal is emitted from said light emitting end of said light-emitting element and projected on said moving path of said through hole of said metal rotary disk in such a manner that said light signal is capable of passing through said through hole when said through hole is rotated to a position right above said light emitting end of said light-emitting element; and
      a photosensing element, which is fastened to face another said side face of said metal rotary disk inside said housing, having an output end connected with said signal line for transmitting digital signals and a signal receiving end extended to position adjacent to said periphery edge of said metal rotary disk and define a distance between said signal receiving end and said periphery edge of said metal rotary disk, wherein said signal receiving end of said photosensing element is positioned opposing to said light emitting end of said light-emitting element in such a manner that said light signal emitted through said through hole is capable of being received and sensed by said photosensing element;
   wherein when said metal rotary disk is induced to rotate by said magnetic field of said voltage magnet with respect to said electric current magnet, said light signal emitted from said light emitting end of said light-emitting element is projected continuously on said periphery edge of said metal rotary disk, wherein when through hole of said metal rotary disk in rotation arrives at said position where said light emitting end is located, said light signal emitted from said light emitting end is received by said light receiving end of said photosensing element via said through hole of said metal rotary disk, wherein when said metal rotary disk completes one revolution, said light signal is received once by said photosensing element, wherein as long as said metal rotary disk rotates, said photosensing element intermittently receives said light signal which is converted into said digital signal and outputted via said signal line.

2. An induction-type alternating current meter, as recited in claim 1, wherein said metal rotary disk has at least an additional through hole at an opposing edge of said periphery edge thereof, so as to render said photosensing element receiving two or more light signals per one revolution of said metal rotary disk.

* * * * *